United States Patent
Wu et al.

(10) Patent No.: US 9,146,282 B2
(45) Date of Patent: Sep. 29, 2015

(54) SYSTEM AND METHOD FOR DETECTING COUNTERFEIT AND DEFECTIVE BATTERIES USING BATTERY CHARACTERISTIC PROFILES

(75) Inventors: Chee-Ming Jimmy Wu, Waterloo (CA); Lyall Kenneth Winger, Waterloo (CA); Christopher Simon Book, Waterloo (CA)

(73) Assignee: BlackBerry Limited, Waterloo, Ontario (CA)

(*) Notice: Subject to any disclaimer, the term of this patent is extended or adjusted under 35 U.S.C. 154(b) by 1307 days.

(21) Appl. No.: 12/959,013

(22) Filed: Dec. 2, 2010

(65) Prior Publication Data

US 2012/0143541 A1    Jun. 7, 2012

(51) Int. Cl.
*G01R 31/36* (2006.01)
*H01M 10/42* (2006.01)

(52) U.S. Cl.
CPC ........ *G01R 31/3631* (2013.01); *G01R 31/3665* (2013.01); *H01M 10/42* (2013.01)

(58) Field of Classification Search
CPC ........... G01R 31/3631; G01R 31/3635; G01R 31/36; G01R 31/3606; H01M 10/42; H01M 10/4221; H01M 10/4285
USPC ...................... 702/63–65; 320/106, 134, 136; 340/636.1, 636.11–636.13
See application file for complete search history.

(56) References Cited

U.S. PATENT DOCUMENTS

| | | | | |
|---|---|---|---|---|
| 5,602,459 A | * | 2/1997 | Rogers | 320/138 |
| 6,084,523 A | * | 7/2000 | Gelnovatch et al. | 340/636.1 |
| 7,119,518 B1 | * | 10/2006 | Dougherty et al. | 320/117 |
| 7,751,994 B2 | * | 7/2010 | Matsumura et al. | 702/63 |
| 2007/0091836 A1 | * | 4/2007 | Oprescu-Surcobe et al. | 370/318 |
| 2007/0170888 A1 | | 7/2007 | Hioki | |

FOREIGN PATENT DOCUMENTS

| | | | | |
|---|---|---|---|---|
| CA | 2694531 A1 | 8/2010 | | |
| EP | 2224574 A1 | * | 9/2010 | H02J 7/00 |
| WO | WO 2007/001822 A2 | 1/2007 | | |

OTHER PUBLICATIONS

Meggyesi, Z.; Search Report from corresponding European Application No. EP10193523.7; search completed May 23, 2011.

* cited by examiner

*Primary Examiner* — Manuel L Barbee
(74) *Attorney, Agent, or Firm* — Thomas Grzesik; Fleit Gibbons Gutman Bongini & Bianco P.L.

(57) ABSTRACT

Systems and methods are disclosed for detecting whether a battery in an electronic device is counterfeit or defective. An actual battery characteristic profile is generated by recording the performance of the battery during use of the battery by the device. This profile is then compared to its corresponding expected characteristic profile. If the profiles are not substantially similar (i.e. if the error between the two curves exceeds a given error threshold), the battery is determined to be counterfeit or defective and responsive action is taken.

28 Claims, 15 Drawing Sheets

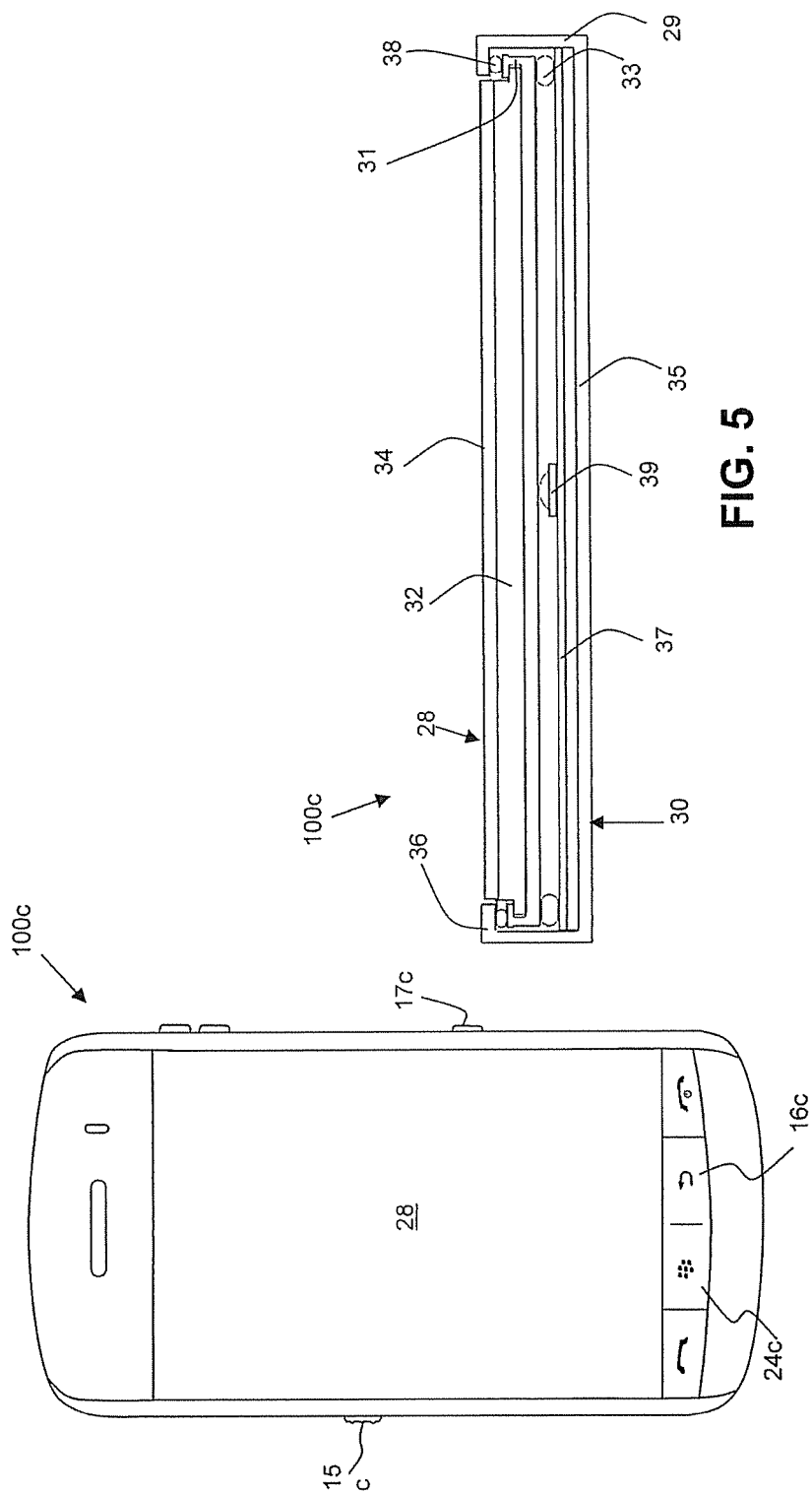

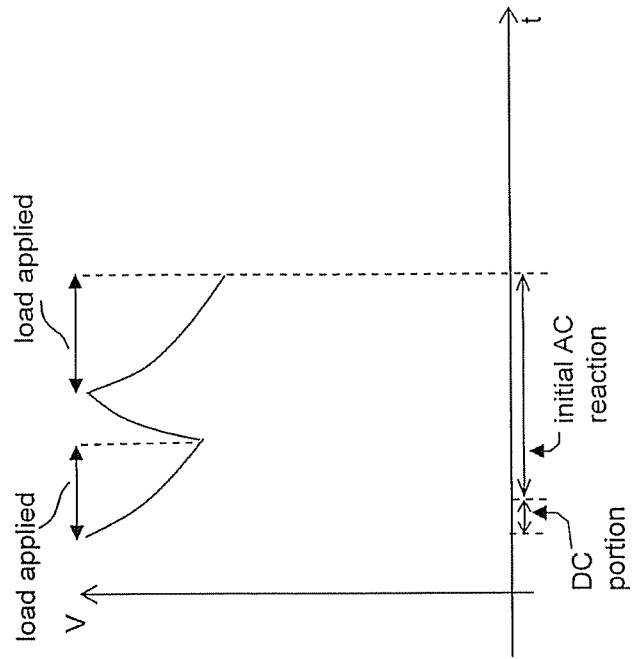
FIG. 9-B
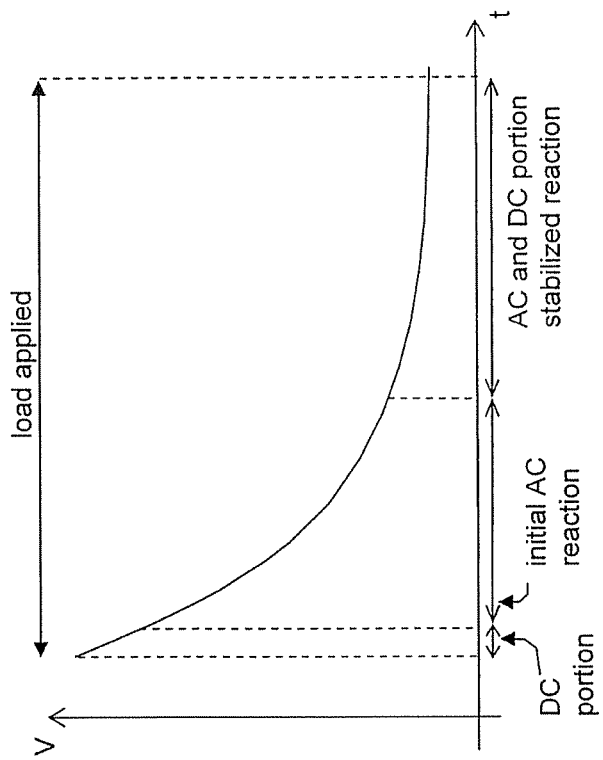
FIG. 9-A

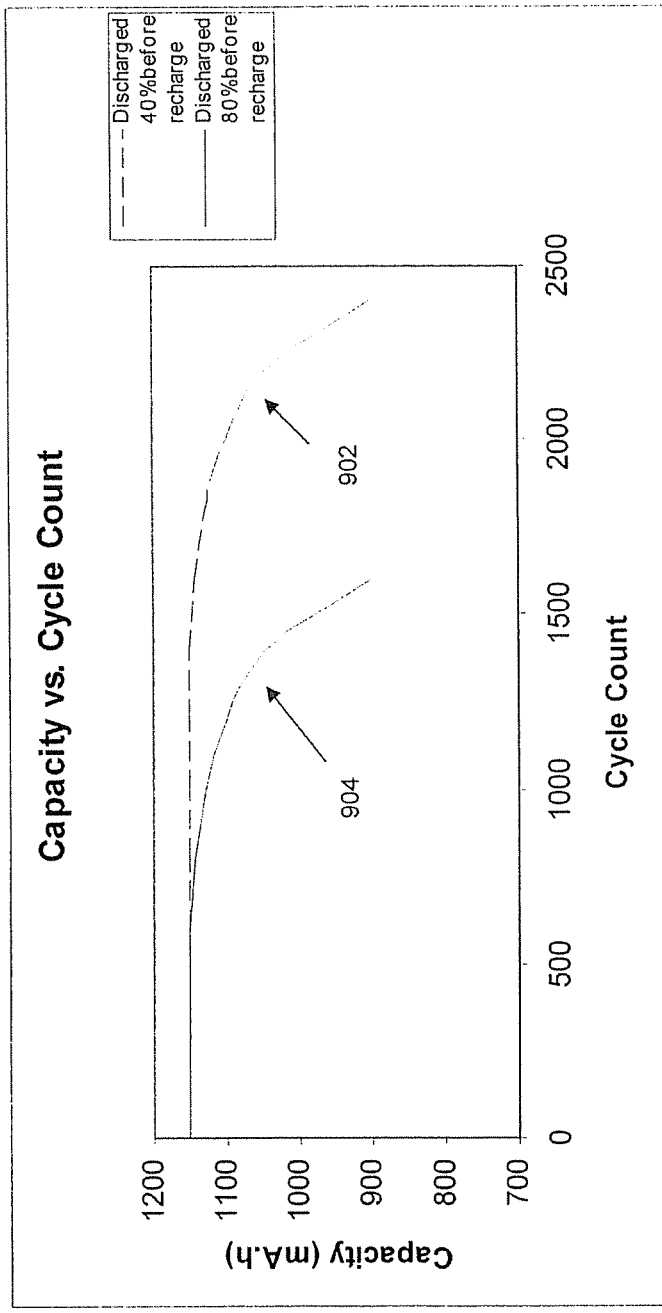
FIG. 10-A

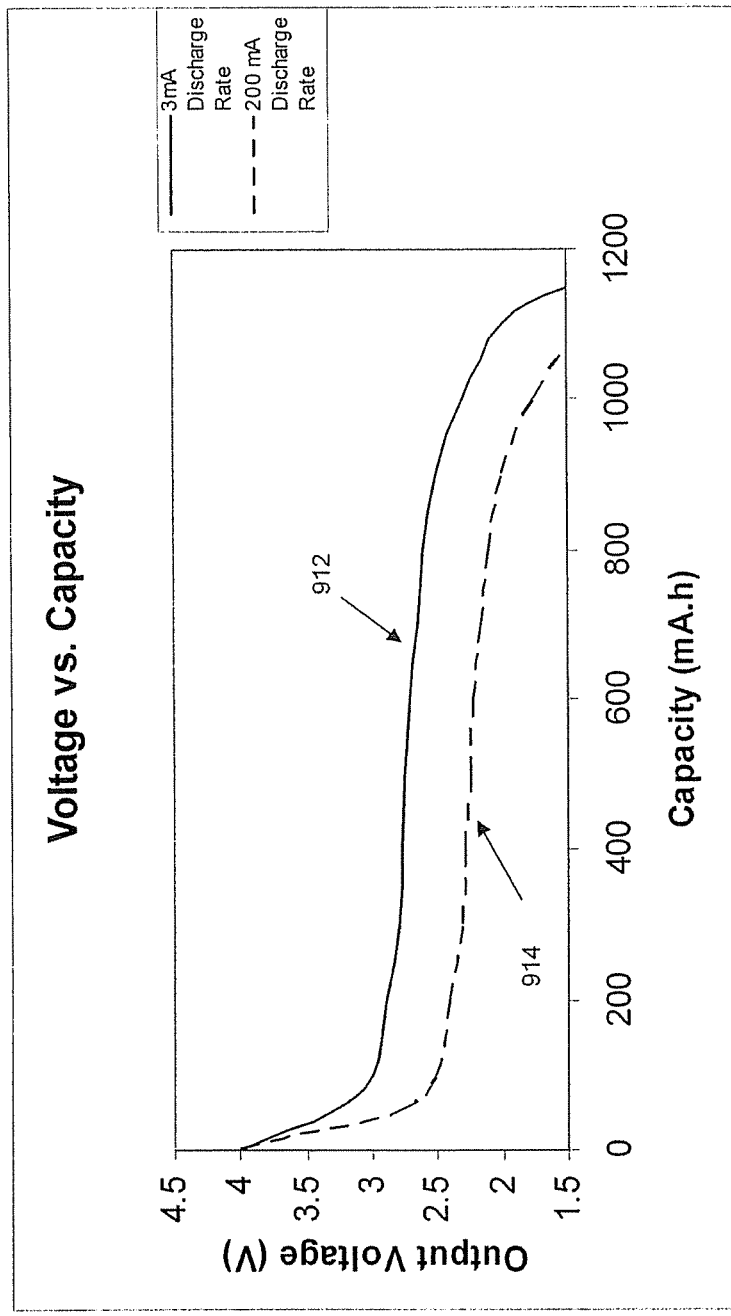
FIG. 10-B

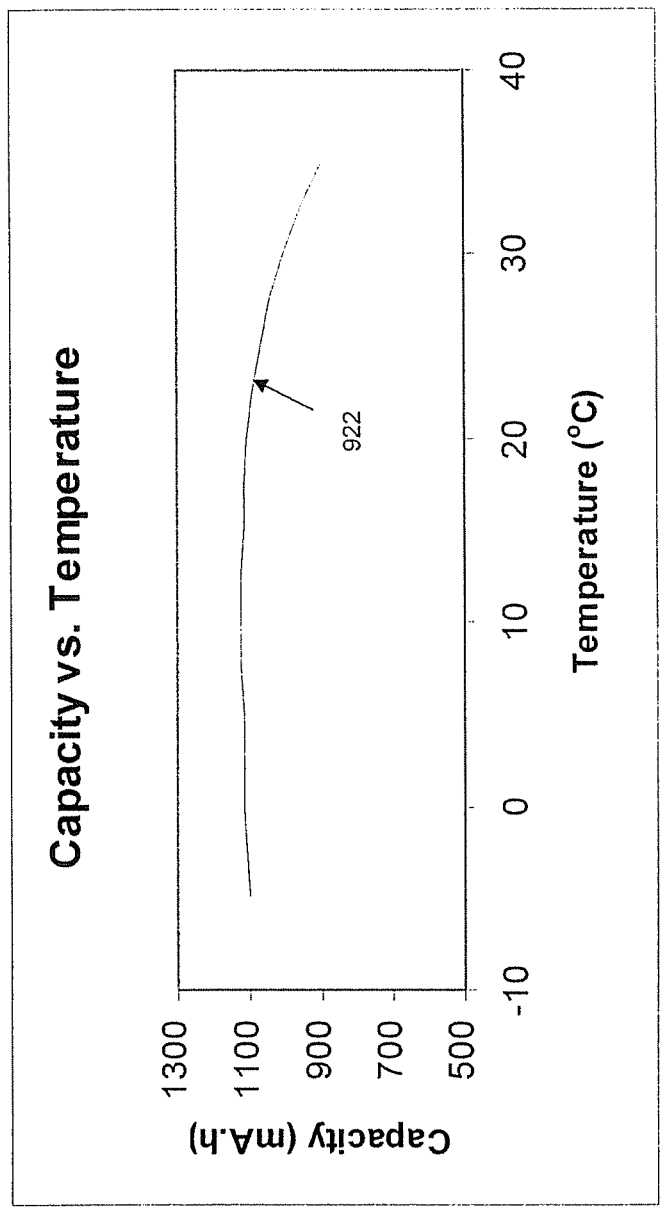
FIG. 10-C

SYSTEM AND METHOD FOR DETECTING COUNTERFEIT AND DEFECTIVE BATTERIES USING BATTERY CHARACTERISTIC PROFILES

TECHNICAL FIELD

The following relates to the detection of battery characteristics.

BACKGROUND

Counterfeit batteries pose a significant concern to manufacturers or sellers of portable electronic devices. The appeal of counterfeit batteries to a consumer is often their reduced cost and their alleged "improved" performance. Of particular concern, however, are situations in which the reduced cost is the result of the omission of safety features. In some cases, not only may a counterfeit battery pose a risk of damage to the portable electronic device, the counterfeit battery may pose a risk of bodily injury to a user of the portable electronic device.

Batteries that are defective may raise similar concerns. The term "defective" as used herein means "not up to specification," and does not necessarily indicate any potential hazard of bodily injury or property damage. Further, as used herein, "defective" may indicate that a single battery is not up to specification for any reason, including imperfections during manufacturing and imperfections acquired after manufacturing. Also, as used herein, "defective" is not used to connote any sort of fault in the creation of the defect, as the cause of the imperfection may be due to actions by anyone, or by the actions of no one.

BRIEF DESCRIPTION

Embodiments will now be described by way of example only with reference to the accompanying drawings, in which:

FIG. 4 is a plan view of yet another mobile device and a display screen therefor;

FIG. 5 is a horizontal cross-sectional view of the mobile device shown in FIG. 4;

FIG. 9 is an example of a collection of characteristic profiles which define the expected parameters of the operation of the battery shown in FIG. 6;

FIG. 10 is an example of a collection of characteristic profiles comprising battery characteristic curves;

DETAILED DESCRIPTION

Figure 1:
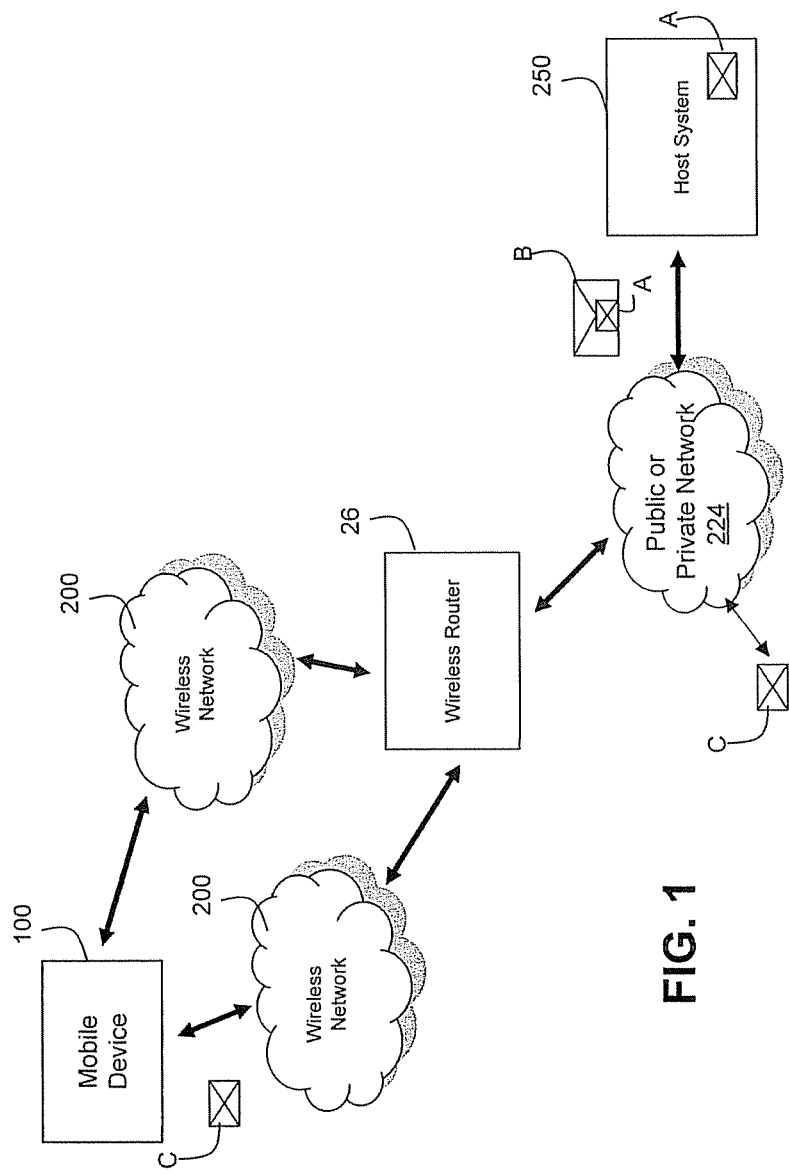
FIG. 1 is a system diagram illustrating the environment in which data items are pushed from a host system to a mobile device.

Methods and devices are discussed below for detection of batteries that may be counterfeit or defective. Batteries that are counterfeit may not be up to specification, and consequently, a single battery may be detected as counterfeit, as defective, or as both. It has been discovered that many counterfeit batteries do not meet some recognized specifications, including specifications set by manufacturers and some industry standards. For example, rechargeable batteries for portable electronic devices may be qualified under standards such as the CTIA Certification Program to operate with a specific mobile device. Generally speaking, these qualification tests are intended to ascertain whether the battery will be able to handle the loads and various thermal conditions that the mobile device will impose on it.

A battery, whether counterfeit or not, or defective or not, has an "actual characteristic profile." As used herein, an actual characteristic profile defines the parameters of operation of a battery under specified conditions. A non-exhaustive set of examples of characteristic profiles is discussed below. The actual characteristic profile can be generated by recording the performance of the battery during actual use. In addition to having an actual characteristic profile, a battery also has a corresponding "expected battery characteristic profile." The expected battery characteristic profile defines the parameters that would be expected when the battery operates under those specified conditions.

In general, it has been recognized that an electronic device, such as a mobile device, can detect whether its battery is counterfeit or defective by comparing one or more actual characteristic profiles obtained and generated by recording the performance of the battery during use with corresponding expected battery characteristic profiles for the battery. An actual characteristic profile for a counterfeit or defective battery may be (and typically will be) much different from an expected characteristic profile. In contrast, a legitimate, non-defective battery may have (and typically does have) an actual characteristic profile that is similar to the expected characteristic profile. Therefore, if an actual battery characteristic profile is not substantially similar to its corresponding expected battery characteristic profile, then the device determines that the battery is either counterfeit or defective and takes the appropriate action (e.g. notifies the user).

Embodiments will now be described with reference to the figures. It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

It will also be appreciated that that any module, component, or device exemplified herein that executes instructions may include or otherwise have access to tangible computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Any application or module herein described may be implemented using computer readable/executable instructions that may be stored or otherwise held by such computer readable media.

Although the following embodiments are presented in the context of mobile devices (such as cell phones, portable computers, tablet devices, smart phones, portable gaming devices, and the like), the principles may equally be applied to other electronic devices, whether 'mobile' or otherwise. Further, the following embodiments may be related to devices sized to be held in a human hand, but the principles may be equally applicable to electronic devices that are not handheld.

A mobile device may be considered to be a two-way communication device with advanced data communication capabilities including the capability to communicate with other mobile devices or computer systems through a network of transceiver stations. The mobile device may also have the capability to allow voice communication. Depending on the functionality provided by the mobile device, it may be referred to as a data messaging device, a two-way pager, a cellular telephone with data messaging capabilities, a wireless Internet appliance, or a data communication device (with or without telephony capabilities).

The mobile device may be one that is used in a system that is configured for continuously routing all forms of pushed information from a host system to the mobile device. One example of such a system will now be described. It may be appreciated that, in general, when it is said that a device is "configured to" or "configured for" a function, the device is capable of carrying out that function.

Referring therefore to FIG. 1, there is shown an example system diagram showing the redirection of user data items (such as message A or C) from a corporate enterprise computer system (host system) 250 to the user's mobile device 100 via a wireless router 26. The wireless router 26 provides the wireless connectivity functionality as it acts to both abstract most of the wireless network's 200 complexities, and it also implements features necessary to support pushing data to the mobile device 100. Although not shown, a plurality of mobile devices may access data from the host system 250. In this example, message A in FIG. 1 represents an internal message sent from, e.g. a desktop computer within the host system 250, to any number of server computers in the corporate network (e.g. LAN), which may, in general, include a database server, a calendar server, an E-mail server or a voice-mail server.

Message C in FIG. 1 represents an external message from a sender that is not directly connected to the host system 250, such as the user's mobile device 100, some other user's mobile device (not shown), or any user connected to the public or private network 224 (e.g. the Internet). Message C could be e-mail, voice-mail, calendar information, database updates, web-page updates or could even represent a command message from the user's mobile device 100 to the host system 250. The host system 250 may comprise, along with the typical communication links, hardware and software associated with a corporate enterprise computer network system, one or more wireless mobility agents, a TCP/IP connection, a collection of datastores, (for example a data store for e-mail could be an off-the-shelf mail server like Microsoft Exchange® Server or Lotus Notes® Server), all within and behind a corporate firewall.

The mobile device 100 may be adapted for communication within wireless network 200 via wireless links, as required by each wireless network 200 being used. As an illustrative example of the operation for a wireless router 26 shown in FIG. 1, consider a data item A, repackaged in outer envelope B (the packaged data item A now referred to as "data item (A)") and sent to the mobile device 100 from an Application Service Provider (ASP) in the host system 250. Within the ASP is a computer program, similar to a wireless mobility agent, running on any computer in the ASP'S environment that is sending requested data items from a data store to a mobile device 100. The mobile-destined data item (A) is routed through the network 224, and through a firewall protecting the wireless router 26.

Although the above describes the host system 250 as being used within a corporate enterprise network environment, this is just one embodiment of one type of host service that offers push-based messages for a handheld wireless device that is capable of notifying and preferably presenting the data to the user in real-time at the mobile device when data arrives at the host system.

By offering a wireless router 26 (sometimes referred to as a "relay"), there are a number of advantages to both the host system 250 and the wireless network 200. The host system 250 in general runs a host service that is considered to be any computer program that is running on one or more computer systems. The host service is said to be running on a host system 250, and one host system 250 can support any number of host services. A host service may or may not be aware of the fact that information is being channelled to mobile devices 100. For example an e-mail or message program 138 (see FIG. 7) might be receiving and processing e-mail while an associated program (e.g. an e-mail wireless mobility agent) is also monitoring the mailbox for the user and forwarding or pushing the same e-mail to a wireless device 100. A host service might also be modified to prepare and exchange information with mobile devices 100 via the wireless router 26, like customer relationship management software. In a third example, there might be a common access to a range of host services. For example a mobility agent might offer a Wireless Access Protocol (WAP) connection to several databases.

As discussed above, a mobile device 100 may be a handheld two-way wireless paging computer as exemplified in the figures, a wirelessly enabled palm-top computer, a mobile telephone with data messaging capabilities, a PDA with mobile phone capabilities, a wirelessly enabled laptop computer, a vending machine with an associated OEM radio modem, a wirelessly-enabled heart-monitoring system or, alternatively, it could be other types of mobile data communication devices capable of sending and receiving messages via a network connection. Although the system is exemplified as operating in a two-way communications mode, certain aspects of the system could be used in a "one and one-half" or acknowledgment paging environment, or even with a one-way paging system. In such limited data messaging environments, the wireless router 26 still could abstract the mobile device 100 and wireless network 200, offer push services to standard web-based server systems and allow a host service in a host system 250 to reach the mobile device 100 in many countries.

The host system 250 shown herein has many methods when establishing a communication link to the wireless router 26. For one skilled in the art of data communications the host system 250 could use connection protocols like TCP/IP, X.25, Frame Relay, ISDN, ATM or many other protocols to establish a point-to-point connection. Over this connection there are several tunneling methods available to package and send the data, some of these include: HTTP/HTML, HTTP/XML, HTTP/Proprietary, FTP, SMTP or some other proprietary data exchange protocol. The type of host systems 250 that might employ the wireless router 26 to perform push could include: field service applications, e-mail services, stock quote services, banking services, stock trading services, field sales applications, advertising messages and many others. This wireless network 200 abstraction is made possible by the wireless router 26, which implements this routing and push functionality. The type of user-selected data items being exchanged by the host could include: E-mail messages, calendar events, meeting notifications, address entries, journal entries, personal alerts, alarms, warnings, stock quotes, news bulletins, bank account transactions, field service updates, stock trades, heart-monitoring information, vending machine stock levels, meter reading data, GPS data, etc., but could, alternatively, include any other type of message that is transmitted to the host system 250, or that the host system 250 acquires through the use of intelligent agents, such as data that is received after the host system 250 initiates a search of a database or a website or a bulletin board.

The wireless router 26 provides a range of services to make creating a push-based host service possible. Examples of wireless networks protocols for communicating between mobile device 100 and wireless router 26 include: (1) Code Division Multiple Access (CDMA), (2) the Groupe Special Mobile or the Global System for Mobile Communications (GSM) and the General Packet Radio Service (GPRS), and (3) the upcoming third-generation (3G) and fourth generation (4G) network protocols like EDGE, UMTS and HSDPA, LTE, Wi-Max etc. Some older examples of data-centric networks include, but are not limited to: (1) the Mobitex Radio Network ("Mobitex") and (2) the DataTAC Radio Network ("DataTAC").

To be effective in providing push services for host systems 250, the wireless router 26 may implement a set of defined functions. It can be appreciated that one could select many different hardware configurations for the wireless router 26, however, many of the same or similar set of features would likely be present in the different configurations.

Figure 3:
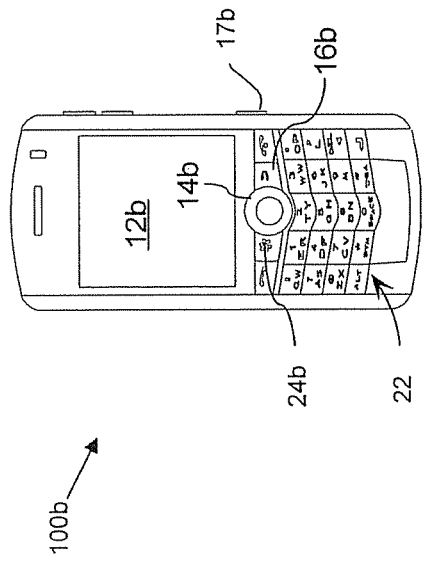
FIG. 3 is a plan view of another mobile device and a display screen therefor.
Figure 2:
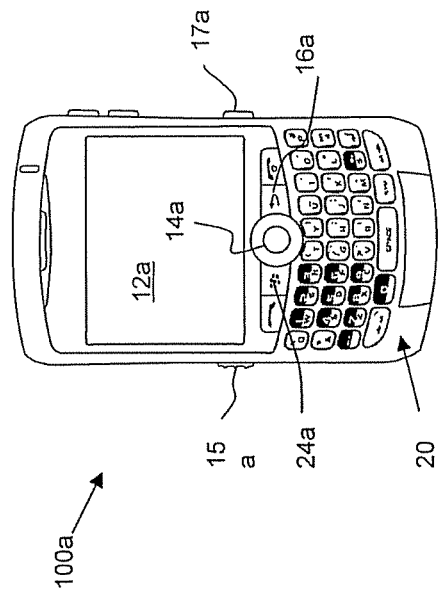
FIG. 2 is a plan view of a mobile device and a display screen therefor.

Referring next to FIGS. 2 through 5, one embodiment of a mobile device 100a is shown in FIG. 2, another embodiment of a mobile device 100b is shown in FIG. 3, and another embodiment of a mobile device 100c is shown in FIGS. 4 and 5. It will be appreciated that the numeral "100" will hereinafter refer to any mobile device 100, including the embodiments 100a, 100b and 100c, those embodiments enumerated above, or otherwise. It will also be appreciated that a similar numbering convention may be used for other general features common between FIGS. 2 through 4 such as a display 12, a positioning device 14, a cancel or escape button 16, a camera button 17, and a menu or option button 24.

The mobile device 100a shown in FIG. 2 comprises a display 12a and the cursor or view positioning device 14 shown in this embodiment is a trackball 14a. Positioning device 14 may serve as another input member and is both rotational to provide selection inputs to the main processor 102 (see FIG. 7) and can also be pressed in a direction generally toward housing to provide another selection input to the processor 102. Trackball 14a permits multi-directional positioning of the selection cursor (not shown) such that the selection cursor can be moved in an upward direction, in a downward direction and, if desired and/or permitted, in any diagonal direction. The trackball 14a is in this example situated on the front face of a housing for mobile device 100a as shown in FIG. 2 to enable a user to manoeuvre the trackball 14a while holding the mobile device 100a in one hand. The trackball 14a may serve as another input member (in addition to a directional or positioning member) to provide selection inputs to the processor 102 and can preferably be pressed in a direction towards the housing of the mobile device 100b to provide such a selection input.

The display 12 may include a selection cursor that depicts generally where the next input or selection will be received. The selection cursor may comprise a box, alteration of an icon or any combination of features that enable the user to identify the currently chosen icon or item. The mobile device 100a in FIG. 2 also comprises a programmable convenience button 15a to activate a selected application such as, for example, a calendar or calculator. Further, mobile device 100a includes an escape or cancel button 16a, a camera button 17a, a menu or option button 24a and a keyboard 20. The camera button 17 is able to activate photo-capturing functions when pressed preferably in the direction towards the housing. The menu or option button 24 loads a menu or list of options on display 12a when pressed. In this example, the escape or cancel button 16a, the menu option button 24a, and keyboard 20 are disposed on the front face of the mobile device housing, while the convenience button 15a and camera button 17a are disposed at the side of the housing. This button placement enables a user to operate these buttons while holding the mobile device 100 in one hand. The keyboard 20 is, in this embodiment, a standard QWERTY keyboard.

The mobile device 100b shown in FIG. 3 comprises a display 12b and the positioning device 14 in this embodiment is a trackball 14b. The mobile device 100b also comprises a menu or option button 24b, a cancel or escape button 16b, and a camera button 17b. The mobile device 100b as illustrated in FIG. 3, comprises a reduced QWERTY keyboard 22. In this embodiment, the keyboard 22, positioning device 14b, escape button 16b and menu button 24b are disposed on a front face of a mobile device housing. The reduced QWERTY keyboard 22 comprises a plurality of multi-functional keys and corresponding indicia including keys associated with alphabetic characters corresponding to a QWERTY array of letters A to Z and an overlaid numeric phone key arrangement.

Referring to FIGS. 4 and 5, the mobile device 100c is shown comprising a touch-sensitive display. In FIG. 4, the touch sensitive display 28 allows a user to interact with the mobile device 100c. In this embodiment, the mobile device 100c also comprises a menu or option button 24c and a cancel or escape button 16c. In this example, a convenience button 15c and camera button 17c are disposed on the sides of the housing.

As best shown in FIG. 5, the housing 30 of the mobile device 100c includes a back 35, a frame 36, which frames the touch-sensitive display 28, sidewalls 29 that extend between and generally perpendicular to the back 35 and the frame 36, and a base 37 that is spaced from and generally parallel to the back 35. The base 37 can be any suitable base and can include, for example, a printed circuit board or flex circuit board. The back 35 includes a plate 2 (FIG. 6) that is releasably attached for insertion and removal of, for example, a battery 130 and a SIM/RUIM card (not shown). It will be appreciated that the back 35, the sidewalls 29 and the frame 36 can be injection molded, for example. In the exemplary mobile device 100c shown in FIG. 4, the frame 36 is generally rectangular with rounded corners although other shapes are possible.

The display device 32 and the overlay 34 can be supported on a support tray 31 of suitable material such as magnesium for providing mechanical support to the display device 32 and overlay 34. The display device 32 and overlay 34 are biased away from the base 37, toward the frame 36 by biasing elements 33 such as gel pads between the support tray 31 and the base 37. Compliant spacers 38, which can also be in the faun of gel pads for example, are located between an upper portion of the support tray 31 and the frame 36. The touch screen display 28 is moveable within the housing 30 as the touch screen display 28 can be moved toward the base 37, thereby compressing the biasing elements 33. The touch screen display 28 can also be pivoted within the housing 30 with one side of the touch screen display 28 moving toward the base 37, thereby compressing the biasing elements 33 on the same side of the touch screen display 28 that moves toward the base 37.

In the present example, the switch 39 is supported on one side of the base 37 which can be printed circuit board while the opposing side provides mechanical support and electrical connection for other components (not shown) of the mobile device 100c. The switch 39 can be located between the base 37 and the support tray 31. The switch 39, which can be a mechanical dome-type switch, for example, can be located in any suitable position such that displacement of the touch screen display 28 resulting from a user pressing the touch screen display 28 with sufficient force to overcome the bias and to overcome the actuation force for the switch 39, depresses and actuates the switch 39. In the present embodiment the switch 39 is in contact with the support tray 31. Thus, depression of the touch screen display 28 by user application of a force thereto, causes actuation of the switch 39, thereby providing the user with a positive tactile quality during user interaction with the user interface of the portable electronic device 20. The switch 39 is not actuated in the rest position shown in FIG. 5, absent applied force by the user. It will be appreciated that the switch 39 can be actuated by pressing anywhere on the touch screen display 28 to cause movement of the touch screen display 28 in the form of movement parallel with the base 37 or pivoting of one side of the touch screen display 28 toward the base 37. The switch 39 is connected to a processor and can be used for further input to the processor when actuated. Although a single switch is shown any suitable number of switches can be used and can be located in any suitable position.

The touch screen display 28 can be any suitable touch screen display such as a capacitive touch screen display. A capacitive touch screen display 28 includes the display 32 and the touch-sensitive overlay 34, in the form of a capacitive touch-sensitive overlay 34. It will be appreciated that the capacitive touch-sensitive overlay 34 includes a number of layers in a stack and is fixed to the display 32 via a suitable optically clear adhesive. The layers can include, for example a substrate fixed to the LCD display 32 by a suitable adhesive, a ground shield layer, a barrier layer, a pair of capacitive touch sensor layers separated by a substrate or other barrier layer, and a cover layer fixed to the second capacitive touch sensor layer by a suitable adhesive. The capacitive touch sensor layers can be any suitable material such as patterned indium tin oxide (ITO).

In the present example, the X and Y location of a touch are both determined with the X location determined by a signal generated as a result of capacitive coupling with one of the touch sensor layers and the Y location determined by the signal generated as a result of capacitive coupling with the other of the touch sensor layers. Each of the touch-sensor layers provides a signal to the controller 36 as a result of capacitive coupling with a suitable object such as a finger of a user or a conductive object held in a bare hand of a user resulting in a change in the electric field of each of the touch sensor layers. The signals represent the respective X and Y touch location values. It will be appreciated that other attributes of the user's touch on the touch screen display 28 can be determined. For example, the size and the shape of the touch on the touch screen display 28 can be determined in addition to the location (X and Y values) based on the signals received at the controller 36 from the touch sensor layers.

As will be appreciated, a controller interprets touch events detected on the touch screen display 28, and controls the portable electronic device 20 accordingly. As used herein, a touch event can be, for example, a single touch, a combination of touches, such as a "double touch", a "touch and hold", a "touch and drag", or a touch made with sufficient force to depress the switch 39 described above. The interpretation of a given touch event will depend on the software and implementation details used by the portable electronic device 20. According to an embodiment, an activation touch event, also referred to as a "click" touch event or "clicking", is a touch event where sufficient force is applied to the touch screen 38 to depress or activate the switch 39, and to provide tactile feedback to the user. Such an activation touch event invokes an action as determined by the underlying application and as displayed to the user in a graphical user interface (GUI). As used herein, a user selection is made by such an activation touch event. According to an embodiment, a highlighting touch event, also referred to as a "focus" touch event, is a touch event where the touch screen display 28 is touched lightly without sufficient force to activate the switch 38, and causes the item so touched to be highlighted, or otherwise visibly selected, for further action.

It will be appreciated that for the mobile device 100, a wide range of one or more positioning or cursor/view positioning mechanisms such as a touch pad, a positioning wheel, a joystick button, a mouse, a touchscreen, a set of arrow keys, a tablet, an accelerometer (for sensing orientation and/or movements of the mobile device 100 etc.), or other whether presently known or unknown may be employed. Similarly, any variation of keyboard 20, 22 may be used. It will also be appreciated that the mobile devices 100 shown in FIGS. 2 through 5 are for illustrative purposes only and various other mobile devices 100 are equally applicable to the following examples. For example, other mobile devices 100 may include the trackball 14b, escape button 16b and menu or option button 24 similar to that shown in FIG. 3 only with a full or standard keyboard of any type. Other buttons may also be disposed on the mobile device housing such as colour coded "Answer" and "Ignore" buttons to be used in telephonic communications. In another example, the display 12 may itself be touch sensitive thus itself providing an input mechanism in addition to display capabilities. Furthermore, the housing for the mobile device 100 should not be limited to the single-piece configurations shown in FIGS. 2 through 5, other configurations such as clamshell or "flip-phone" configurations are also applicable.

Figure 6:
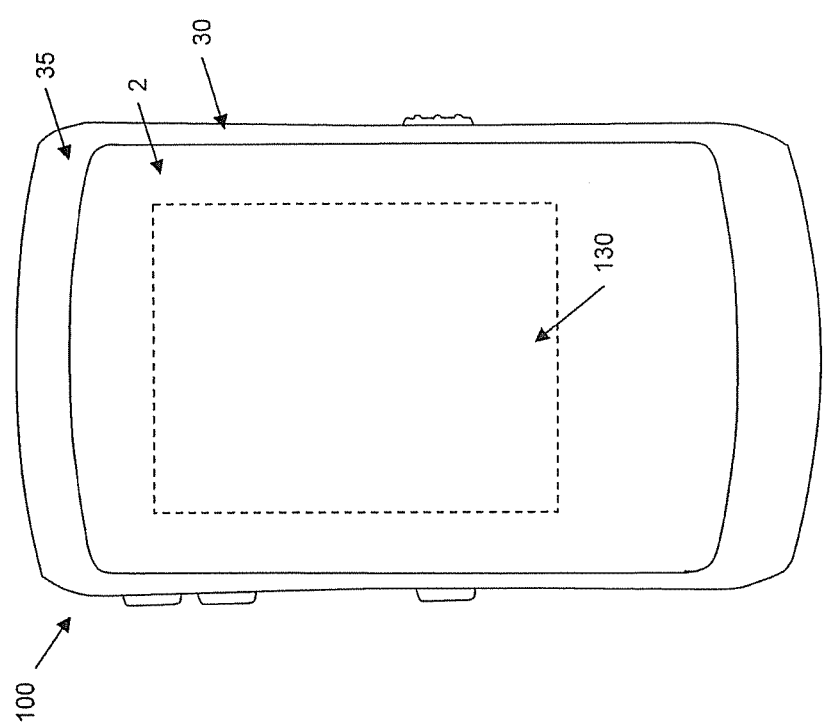
FIG. 6 is a rear view of a mobile device.

FIG. 6 shows a rear view of a mobile device 100. In FIG. 6, the shape of mobile device 100 corresponds to that of mobile device 100a for illustrative purposes only. It will be appreciated that other shaped mobile devices, such as mobile device 100*b* and 100*c* or clamshell or "flip-phone" shaped mobile devices will have similar components as shown in FIG. 6.

The housing 30 of mobile device 100 includes a back 35. The back 35 includes a plate 2 that is releasably attached for insertion and removal of a rechargable battery 130 and possibly a SIM/RUIM card (not shown). The plate 2 protects the battery 130 from being exposed to the outside environment and protects the user from inadvertently manipulating the battery 130 during operation.

To aid the reader in understanding the structure of the mobile device 100 and how it communicates with the wireless network 200, reference will now be made to FIGS. 7 and 8.

Figure 7:
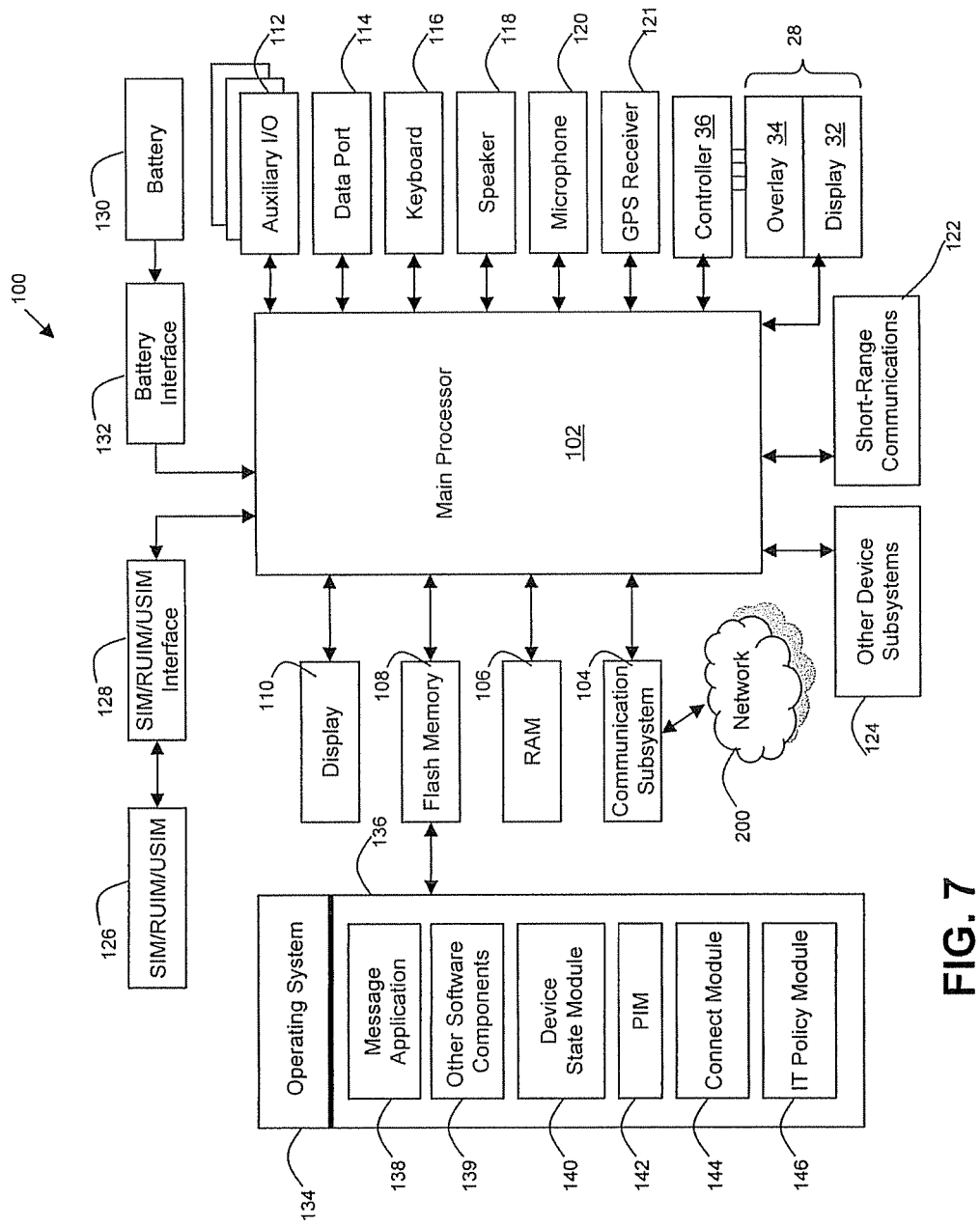
FIG. 7 is a block diagram of an exemplary embodiment of a mobile device.

Referring first to FIG. 7, shown therein is a block diagram of an exemplary embodiment of a mobile device 100. The mobile device 100 comprises a number of components such as a main processor 102 that controls the overall operation of the mobile device 100. Communication functions, including data and voice communications, are performed through a communication subsystem 104. The communication subsystem 104 receives messages from and sends messages to a wireless network 200. In this exemplary embodiment of the mobile device 100, the communication subsystem 104 is configured in accordance with the Global System for Mobile Communication (GSM) and General Packet Radio Services (GPRS) standards, which is used worldwide. Other communication configurations that are equally applicable are the 3G and 4G networks such as EDGE, UMTS and HSDPA, LTE, Wi-Max etc. New standards are still being defined, but it is believed that they will have similarities to the network behaviour described herein, and it will also be understood by persons skilled in the art that the embodiments described herein are intended to use any other suitable standards that are developed in the future. The wireless link connecting the communication subsystem 104 with the wireless network 200 represents one or more different Radio Frequency (RF) channels, operating according to defined protocols specified for GSM/GPRS communications.

The main processor 102 also interacts with additional subsystems such as a Random Access Memory (RAM) 106, a flash memory 108, a display 110, an auxiliary input/output (I/O) subsystem 112, a data port 114, a keyboard 116, a speaker 118, a microphone 120, a GPS receiver 121, short-range communications 122, and other device subsystems 124.

Some of the subsystems of the mobile device 100 perform communication-related functions, whereas other subsystems may provide "resident" or on-device functions. By way of example, the display 110 and the keyboard 116 may be used for both communication-related functions, such as entering a text message for transmission over the network 200, and device-resident functions such as a calculator or task list.

The mobile device 100 can send and receive communication signals over the wireless network 200 after required network registration or activation procedures have been completed. Network access is associated with a subscriber or user of the mobile device 100. To identify a subscriber, the mobile device 100 may use a subscriber module component or "smart card" 126, such as a Subscriber Identity Module (SIM), a Removable User Identity Module (RUIM) or a Universal Subscriber Identity Module (USIM). In the example shown, a SIM/RUIM/USIM 126 is to be inserted into a SIM/RUIM/USIM interface 128 in order to communicate with a network. Without the component 126, the mobile device 100 is not fully operational for communication with the wireless network 200. Once the SIM/RUIM/USIM 126 is inserted into the SIM/RUIM/USIM interface 128, it is coupled to the main processor 102.

The mobile device 100 is a battery-powered device and therefore includes a battery interface 132 for receiving one or more rechargeable batteries 130. In at least some embodiments, the battery 130 can be a smart battery with an embedded microprocessor. The battery interface 132 is coupled to a regulator (not shown), which assists the battery 130 in providing power V+ to the mobile device 100.

The mobile device 100 also includes an operating system 134 and software components 136 to 146 which are described in more detail below. The operating system 134 and the software components 136 to 146 that are executed by the main processor 102 are typically stored in a persistent store such as the flash memory 108, which may alternatively be a read-only memory (ROM) or similar storage element (not shown). Those skilled in the art will appreciate that portions of the operating system 134 and the software components 136 to 146, such as specific device applications, or parts thereof, may be temporarily loaded into a volatile store such as the RAM 106. Other software components can also be included, as is well known to those skilled in the art.

The subset of software applications 136 that control basic device operations, including data and voice communication applications, may be installed on the mobile device 100 during its manufacture. Software applications may include a message application 138, a device state module 140, a Personal Information Manager (PIM) 142, a connect module 144 and an IT policy module 146. A message application 138 can be any suitable software program that allows a user of the mobile device 100 to send and receive electronic messages, wherein messages are typically stored in the flash memory 108 of the mobile device 100. A device state module 140 provides persistence, i.e. the device state module 140 ensures that important device data is stored in persistent memory, such as the flash memory 108, so that the data is not lost when the mobile device 100 is turned off or loses power. A PIM 142 includes functionality for organizing and managing data items of interest to the user, such as, but not limited to, e-mail, text messages, instant messages, contacts, calendar events, and voice mails, and may interact with the wireless network 200. A connect module 144 implements the communication protocols that are required for the mobile device 100 to communicate with the wireless infrastructure and any host system 250, such as an enterprise system, that the mobile device 100 is authorized to interface with. An IT policy module 146 receives IT policy data that encodes the IT policy, and may be responsible for organizing and securing rules such as the "Set Maximum Password Attempts" IT policy.

Other types of software applications or components 139 can also be installed on the mobile device 100. These software applications 139 can be pre-installed applications or third party applications, which are added after the manufacture of the mobile device 100. Examples of third party applications include games, calculators, utilities, etc.

The additional applications 139 can be loaded onto the mobile device 100 through at least one of the wireless network 200, the auxiliary I/O subsystem 112, the data port 114, the short-range communications subsystem 122, or any other suitable device subsystem 124.

The data port 114 can be any suitable port that enables data communication between the mobile device 100 and another computing device. The data port 114 can be a serial or a parallel port. In some instances, the data port 114 can be a USB port that includes data lines for data transfer and a supply line that can provide a charging current to charge the battery 130 of the mobile device 100.

For voice communications, received signals are output to the speaker 118, and signals for transmission are generated by the microphone 120. Although voice or audio signal output is accomplished primarily through the speaker 118, the display 110 can also be used to provide additional information such as the identity of a calling party, duration of a voice call, or other voice call related information.

For composing data items, such as e-mail messages, for example, a user or subscriber could use the touch-sensitive overlay 34 on the display 32 that are part of the touch screen display 28, in addition to possibly the auxiliary I/O subsystem 122. The auxiliary I/O subsystem 112 may include devices such as: a mouse, track ball, infrared fingerprint detector, or a roller wheel with dynamic button pressing capability. A composed item may be transmitted over the wireless network 200 through the communication subsystem 104.

Figure 8:
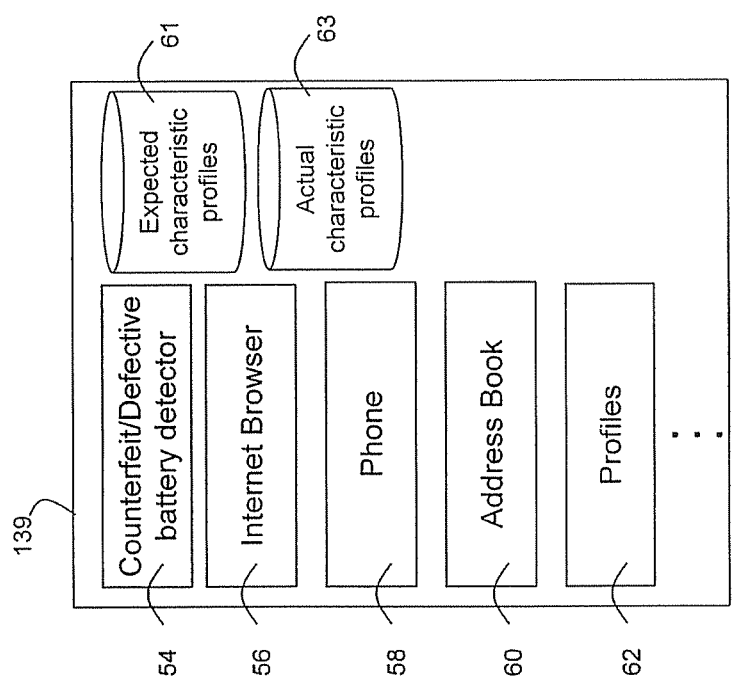
FIG. 8 is a block diagram illustrating exemplary ones of the other software applications and components shown in FIG. 7.

FIG. 8 shows an example of the other software applications and components 139 that may be stored on and used with the mobile device 100. Only examples are shown in FIG. 8 and such examples are not to be considered exhaustive. In this example, an interne browser 56, phone application 58, address book 60 and a profiles application 62 are shown to illustrate the various features that may be provided by the mobile device 100. It will be appreciated that the various applications may operate independently or may utilize features of other applications. For example, the phone application 58 may use the address book 60 for contact details. For purposes of simplicity, the profiles application 62 may be thought of as relating to profiles other than actual characteristic profiles or expected battery characteristic profiles.

For purposes of simplicity, instructions pertaining to generating actual characteristic profiles, and evaluating actual characteristic profiles with respect to expected battery characteristic profiles, are represented in FIG. 8 by a counterfeit/defective battery detector 54 module or unit. As will be explained in detail below, the counterfeit/defective battery detector 54 compares battery characteristic profiles to determine if the rechargeable battery 130 is counterfeit or defective.

The battery 130 is manufactured for specific operation with mobile device 100 and therefore typically has a specific cathode/anode chemistry, electrolyte, manufacturing process, operating temperature range, etc. The battery 130 has expected parameters of operation given certain loads and conditions. The parameters of operation of the battery 130 given certain loads and conditions can be represented by expected characteristic profiles.

FIG. 9 shows examples of characteristic profiles for the battery 130. Actual and expected characteristic profiles may have similar data and may be presented in a similar fashion (e.g., one parameter as a function of another), although they may be generated in different ways. Expected characteristic profiles are generally not based upon measurements of the battery 130. Expected characteristic profiles may be stored in a memory element such as database 61. Actual characteristic profiles, by contrast, are generally generated by measurements taken during actual use of the battery 130, and may be stored in a memory element such as database 63. For purposes of discussion, it will be assumed that FIG. 9 depicts illustrative data from an actual characteristic profile, generated by monitoring a battery 130 in actual use. For example, in FIG. 9(a), a constant high load is applied to the battery 130 and the voltage of the battery 130 is recorded over time. The Equivalent Series Resistance (ESR) of the battery 130 is composed of an AC portion and a DC portion. It has been learned that the AC portion typically differs between battery vendors and over time. When a high load is applied to the battery, the AC portion is most pronounced during an initial period until the electrolyte components stabilize and a relatively constant ESR results. The voltage reaction of the battery 130 during this initial period after application of a constant high load, and the length of the initial period until the AC and DC portions stabilize are examples of characteristic profiles.

In FIG. 9(b), short high-load pulses are applied to the battery 130 during the initial period when the AC portion of the ESR is most pronounced, and the behaviour of the voltage is recorded. The behaviour of the voltage during application of the short high-load pulses is another example of a characteristic profile of the battery 130.

It will be appreciated that the behaviour of the voltage in FIGS. 9(a) and 9(b) also depends on other conditions (e.g. the temperature of the battery), and that therefore a given characteristic profile is a function of these specific parameters also.

Another example of a battery characteristic profile not shown in the figures is the behaviour of the output voltage of the battery 130 during a short discharge and recharge period, for example, by drawing current from the battery for 100 ms and then using a capacitor to recharge the slightly discharged battery.

The examples outlined above are examples of characteristic profiles that may define the parameters of operation of the battery 130 under specified conditions. The battery 130 is designed and manufactured to have specific characteristic profiles for given parameters of operation, and therefore if the battery 130 is legitimate and operating correctly, it should produce an actual characteristic profile that is close to (within degree of similarity) the expected characteristic profiles. Actual characteristic profiles can be generated by recording the actual performance of the battery 130 during use of the battery 130 by the device 100. For example, as in FIG. 9(b), the device 100 can apply short high load pulses during an initial period when the AC portion of the ESR is most pronounced to record an actual characteristic profile. Expected characteristic profiles may include typical data that generally ought to appear in an actual characteristic profile, and may also include ranges of data.

FIG. 10 shows an example of a collection of conventional battery characteristic curves for the battery 130. Battery characteristic curves can be considered battery characteristic profiles, since they define the performance and parameters of operation of a battery given certain loads and conditions. For example, in FIG. 10(a), the capacity versus cycle count of the battery 130 is shown for different depths of discharge. Battery capacity is typically measured in mA·h and represents the number of hours a battery can supply a given current before the voltage of the battery drops below an acceptable working threshold. Cycle count refers to the number of cycles that have elapsed, where a cycle is defined as a discharge and recharge of the battery. The capacity of a battery typically tends to decrease as the number of cycles increases (i.e. the capacity tends to decrease each time the battery is used and recharged). Also, typically the depth of discharge, i.e., the amount the battery has been discharged before it is recharged, will affect the capacity versus cycle count curve. Curve 902 represents the capacity versus cycle count when the battery 130 is discharged by 40% before recharging. Curve 904 represents the capacity versus cycle count when the battery 130 is discharged by 80% before recharging. As will be appreciated, several capacity versus cycle count curves may be used to characterize the battery 130 since the curve depends on the depth of discharge.

In FIG. 10(b), the output voltage versus capacity of the battery 130 is shown for different discharge rates. The output voltage of a battery will typically decrease as the battery discharges due to increased internal impedance within the battery. Also, discharging a battery at a high rate (i.e. drawing a large current from the battery during operation) will typically lower the capacity of the battery. Curve 912 represents the voltage versus capacity curve when discharging the battery 130 by drawing a current of 3 mA (for example, when the mobile device 100 is on standby). Curve 914 represents the voltage versus capacity curve when discharging the battery 130 by drawing a current of 200 mA (for example, when talking on the mobile device 100). For the battery 130, the capacity decreases when more current is drawn. As will be appreciated, several voltage versus capacity curves may be used to characterize the battery 130 since the curve depends on the current drawn by device 100. Additionally, the voltage versus capacity curve will typically depend on additional factors, such as the cycle count of the battery 130.

As a further example, in FIG. 10(*c*) the capacity versus temperature of the battery 130 is shown as curve 922. Once again, this curve may depend on factors such as the rate of discharge and the cycle count of the battery.

As can be seen from FIGS. 9 and 10, the battery 130 may be characterized by several actual battery characteristic profiles that relate to the parameters of operation of the battery 130 under specified loads and conditions. FIGS. 9 and 10 show only a small sample of all possible characteristic profiles which may relate to the battery 130.

It has been discovered that an actual battery characteristic profile for a counterfeit or defective battery will typically be much different from one or more expected battery characteristic profiles (and different from the actual battery characteristic profiles for a legitimate and non-defective battery). As a result, actual battery characteristic profiles may be used to detect whether a battery is counterfeit or defective by comparing one or more actual battery characteristic profiles obtained and generated during operation with expected battery characteristic profiles. If the one or more actual battery characteristic profiles are not substantially similar to the corresponding expected battery characteristic profiles, then the portable electronic device may determine that the battery is either counterfeit or defective.

Figure 11:
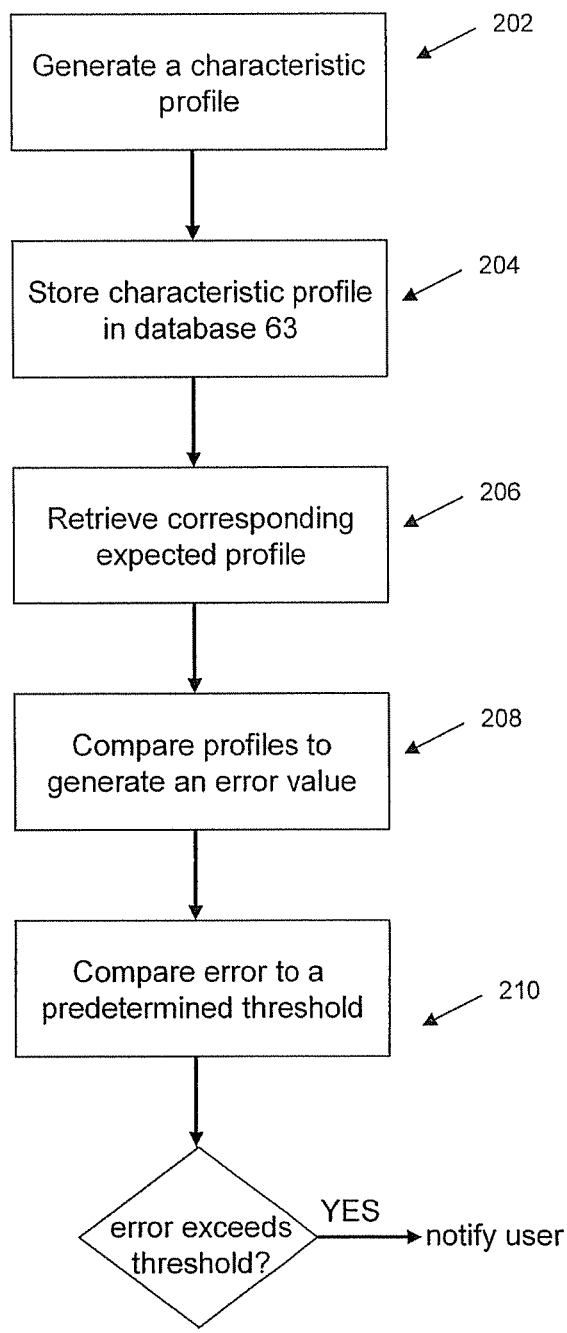
FIG. 11 is schematic of a set of computer executable instructions for detecting a counterfeit or defective battery.
Figure 12:
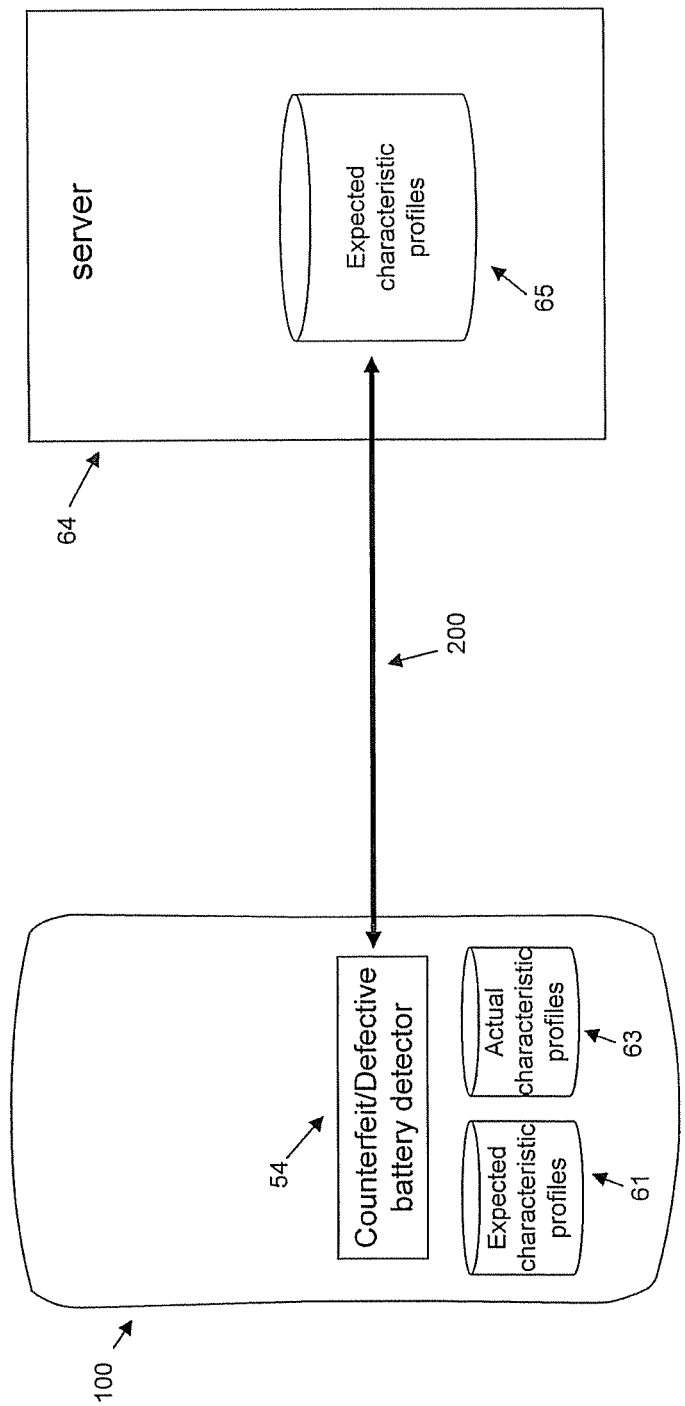
FIG. 12 is a schematic diagram of a mobile device illustrating one embodiment of the counterfeit/defective battery detector.

A first embodiment is described with reference to FIGS. 11 and 12. FIG. 11 discloses a set of computer readable instructions that are used by the counterfeit/defective battery detector 54 for detecting whether a battery is counterfeit or defective. Techniques set forth in FIG. 11 may be carried out on a single portable electronic device (as illustrated in FIGS. 2 through 8), or may be carried out by portable electronic device acting in concert with remote devices, such as depicted in FIG. 12. FIG. 12 shows a schematic of the mobile device 100 in communication with a remote server 64 over a wireless network 200. The remote server 64 includes a central database 65 having stored thereon a large collection of expected battery characteristic profiles for the battery 130 for a variety of different loads and operating conditions. A potential benefit of carrying out the techniques of FIG. 11 in a system such as that shown in FIG. 12 is that the mobile device 100 need not carry the expected battery characteristic profiles in its memory. Further, new or updated expected battery characteristic profiles may be efficiently added to central database 65, and the mobile device 100 may thereby have access to the most recent expected battery characteristic profiles.

The detection of a counterfeit or defective battery will now be described with reference to FIG. 11. First, in step 202, the counterfeit/defective battery detector 54 obtains one or more actual battery characteristic profiles by recording the performance of the battery 130 during use of the battery 130 by the device 100. For purposes of illustration, the counterfeit/defective battery detector 54 may apply a load to battery 130 under a particular set of operating conditions and generate a characteristic profile. For example, the counterfeit/defective battery detector 54 may apply a current of 2 amps over 100 ms to partially discharge the battery 130, and then recharge the battery 130 using a capacitor, and during the discharge and recharge period, record the voltage output of the battery 130. In this case, the characteristic profile would comprise the recorded voltage versus load during this discharge and recharge period. As another example, the counterfeit/defective battery detector 54 may apply short load pulses during an initial period when the AC portion of the ESR is most pronounced and record the behaviour of the voltage. In this case, the characteristic profile would comprise the recorded voltage versus time for the given set of operating conditions.

In step 204, the counterfeit/defective battery detector 54 stores this generated actual characteristic profile in database 63. The characteristic profile may be stored as an array of data points. In the example above, the array of data points would represent the voltage amplitude at each point in time. Data may be stored in other formats as well (for example, a curve may be generated from a set of data points), but for simplicity, the actual characteristic profile will be discussed as a set of data points.

In step 206, the counterfeit/defective battery detector 54 may query local database 61 or remote database 65, or both, to retrieve the corresponding expected characteristic profile. In one implementation, counterfeit/defective battery detector 54 queries the local database 61 to see if the expected characteristic profile is stored there, and if it is not, the counterfeit/defective battery detector 54 queries central database 65 over wireless network 200 to retrieve the corresponding expected characteristic profile. The retrieved expected characteristic profile may be stored in database 61. In step 208, the counterfeit/defective battery detector 54 applies a comparison technique to compare the data representing the actual characteristic profile with the data representing the corresponding expected characteristic profile. Any comparison technique may be used, such as (but not limited to) evaluating the correlation between the actual and expected characteristic profiles, subtracting one from another, calculating the mean square error, finding the largest error between any two corresponding data values in the two sets of data, or any combination thereof. In one implementation, an expected characteristic profiles may include a range of values for the data points, and the counterfeit/defective battery detector 54 can determine whether the actual data points are in or out of that range (or which ones are in range and which ones are not). Regardless of the comparison technique used, the output of the comparison technique is a value (or values) that is representative of how similar or different the two data sets are. This value may be thought of as an error value.

Next, in step 210, the counterfeit/defective battery detector 54 compares this error value with a threshold value that represents the maximum error permitted before the two profiles are not considered to be substantially similar. (The threshold is typically determined, expressly or inferentially, before the actual characteristic profile is generated). If the error value exceeds this threshold, the counterfeit/defective battery detector 54 determines the battery 130 is counterfeit or defective. The counterfeit/defective battery detector 54 takes a responsive action, that is, an action that is responsive to the determination that the battery 130 is counterfeit or defective. In the embodiment of FIG. 11, the responsive action is to send a message to a user interface to notify the user that the battery is not functioning as intended. Other forms of responsive action may also be taken, including (but not limited to), sending a wireless message to a server, deactivating one or more functions or operations of the portable electronic device, prompting the user to obtain a proper replacement battery, notifying a user that device operation may be limited until a proper battery is installed, or powering down the portable electronic device. A further possible responsive action may be to return to step 202 and conduct the detection a second time, using the same characteristic profile or a different characteristic profile. As used herein, "exceeds the threshold" indicates that the actual battery characteristic profile is sufficiently different from the expected battery characteristic profile that the battery 130 is determined to be counterfeit or defective or both.

Figure 13:
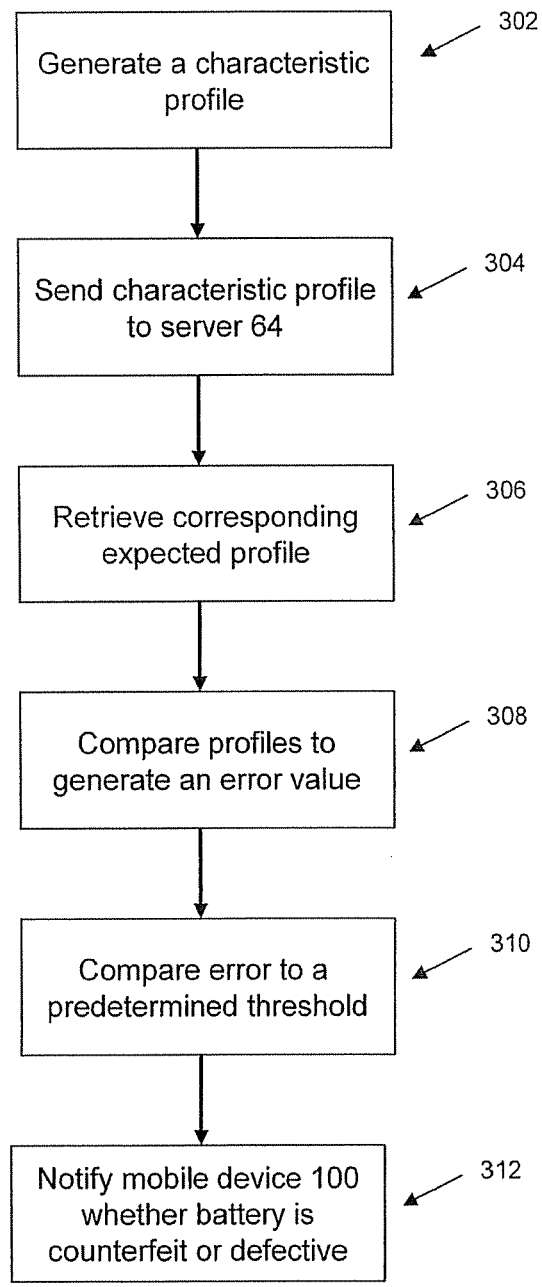
FIG. 13 is a schematic of another set of computer executable instructions for detecting a counterfeit or defective battery.
Figure 14:
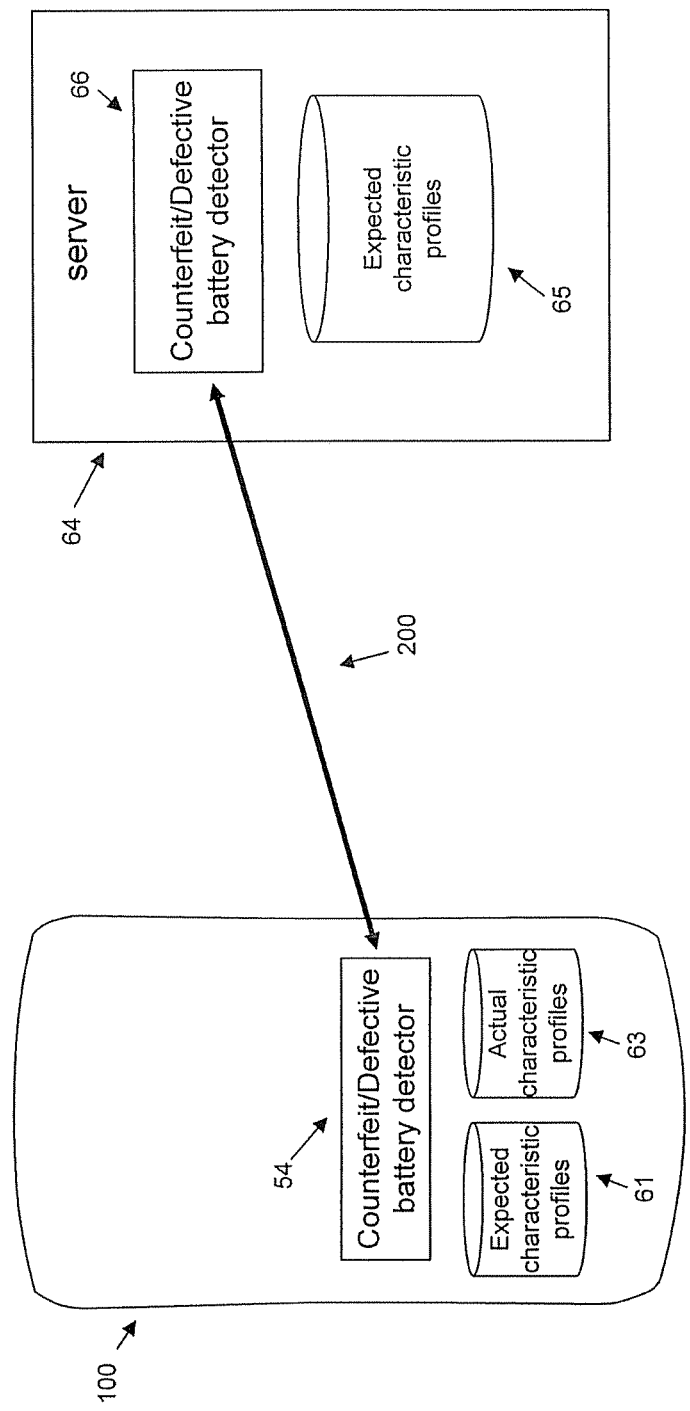
FIG. 14 is a schematic diagram of a mobile device illustrating another embodiment of the counterfeit/defective battery detector.

FIGS. 13 and 14 show an alternative embodiment in which the comparison of the profiles is instead performed remotely by a counterfeit/defective battery detector 66 on the server 64. With reference to FIG. 13, in step 302, the counterfeit/defective battery detector 54 on the mobile device 100 applies a load to the battery 130 under specific operating conditions and generates an actual characteristic profile. Then, in step 304, the counterfeit/defective battery detector 54 on the mobile device 100 sends this actual characteristic profile over the wireless network 200 to the remote server 64. In step 306, the counterfeit/defective battery detector 66 on the remote server 64 queries the central database 65 to retrieve the expected characteristic profile corresponding with the actual characteristic profile sent from the device 100 in step 306. Once the corresponding expected characteristic profile is retrieved from the database 65, in step 308, the counterfeit/defective battery detector 66 on the remote server 64 applies a comparison technique to compare the data representing the actual characteristic profile generated in step 302 with the data representing the corresponding expected characteristic profile retrieved in step 306. Next, in step 310, the counterfeit/defective battery detector 66 on the remote server 64 compares the error value generated by the comparison technique with a threshold value. If the error value exceeds this threshold, the counterfeit/defective battery detector 66 determines the battery 130 is either counterfeit or defective. Finally, in step 312, the counterfeit/defective battery detector 66 on the remote server 64 uses wireless link 200 to notify the counterfeit/defective battery detector 54 of the mobile device 100 whether the battery 130 is counterfeit or defective. If the battery 130 is deemed to be counterfeit or defective, the counterfeit/defective battery detector 54 on the mobile device 100 takes one or more responsive action.

It is contemplated that the battery characteristic profile generated and compared can comprise a battery characteristic curve, such as a battery characteristic curve shown in FIG. 10. To this end, FIG. 15 discloses a variation of the embodiment shown in FIG. 11 in which a battery characteristic curve is compared to determine whether the battery 130 is counterfeit or defective.

Figure 15:
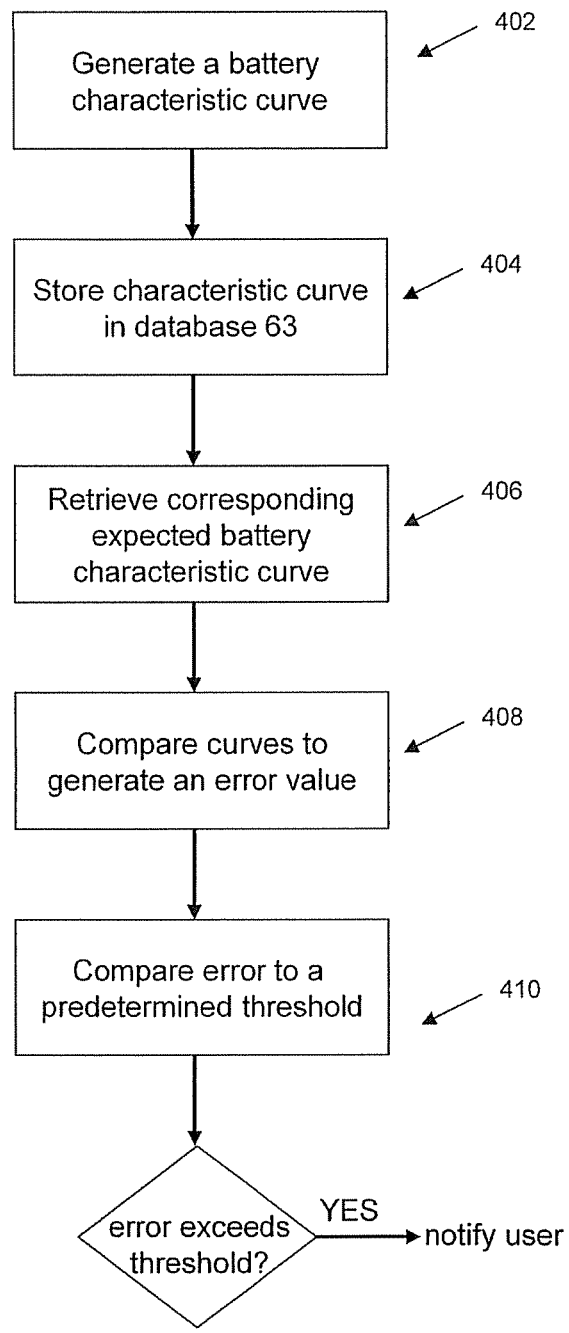
FIG. 15 is a schematic of yet another set of computer executable instructions for detecting a counterfeit or defective battery.

Turning therefore to FIG. 15, first in step 402, the counterfeit/defective battery detector 54 records performance of the battery 130 during use of the battery 130 by the mobile device 100 over a designated period of time in order to generate an actual battery characteristic curve based on the operation of the battery 130. For example, the battery characteristic curve generated may be the output voltage versus capacity of the battery 130 for a given load and temperature range.

Next, in step 404, the counterfeit/defective battery detector 54 then stores this actual battery characteristic curve in the database 63. Then, in step 406, the counterfeit/defective battery detector 54 queries database 61 to check whether the corresponding expected battery characteristic curve is stored in database 61 (or whether the corresponding expected battery characteristic curve is stored in database 65 on remote server 64), to retrieve the corresponding expected battery characteristic curve. Next, in step 408, the counterfeit/defective battery detector 54 applies a comparison technique to generate an error value representing the difference between the actual battery characteristic curve generated in step 402 and the corresponding expected battery characteristic curve.

Next, in step 410, the counterfeit/defective battery detector 54 compares this error value with a predetermined threshold value. If the error value exceeds this threshold, the counterfeit/defective battery detector 54 determines that the battery 130 is counterfeit or defective. In this case, the counterfeit/defective battery detector 54 takes one or more responsive actions.

One potential advantage in the embodiments described with reference to FIGS. 11 to 15 is that the defective/counterfeit module 54 can be configured to check whether the battery 130 is counterfeit or defective immediately or soon after powering up, so that if the battery is counterfeit or defective, the user is notified before he or she begins operating the device 100.

There are a number of anti-counterfeit measures currently implemented in many mobile devices to detect a counterfeit battery. A further potential advantage is that the methods and devices described herein may act to supplant the other measures, or may act in concert with the other measures.

Further, the techniques described herein support consideration of multiple battery characteristic profiles. Use of multiple characteristic profiles may be useful in identifying particular counterfeit batteries or diagnosing particular kinds of defects.

Another potential benefit from the techniques described herein is that they may be performed automatically without command or intervention from the user, and may be effectively invisible to the user unless there is a concern about the battery.

Although the above has been described with reference to certain specific embodiments, various modifications thereof will be apparent to those skilled in the art without departing from the scope of the claims appended hereto.

The invention claimed is:

1. A method of detecting whether a battery in an electronic device is counterfeit or defective, the method comprising:
   determining one or more specified conditions for operating the battery on the electronic device;
   generating, by the electronic device and based on the one or more specified conditions, at least an electrical load;
   applying, by the electronic device, the electrical load to the battery, the electrical load changing one or more electrical characteristics of the battery;
   generating, on the electronic device, an actual battery characteristic profile by recording performance of the battery during use of the battery while the electrical load being applied;
   retrieving from a memory element, an expected battery characteristic profile defining parameters expected when a legitimate battery operates under specified conditions corresponding to the electrical load, the memory element storing a plurality of expected battery characteristic profiles each corresponding to different conditions;
   comparing the expected battery characteristic profile with the actual battery characteristic profile to determine a value representing an error between the expected battery characteristic profile and said actual battery characteristic profile; and
   taking a responsive action on the electronic device when the value exceeds an error threshold.

2. The method of claim 1, wherein retrieving an expected battery characteristic profile corresponding to the actual battery characteristic profile comprises:
checking if the expected battery characteristic profile is stored on a database on the electronic device; and if not then
requesting from a remote server the expected battery characteristic profile.

3. The method of claim 1, wherein at least the retrieving and comparing operations of the method are performed by a counterfeit/defective battery detector located on a remote server, and the counterfeit/defective battery detector communicates with the electronic device over a wireless link.

4. The method of claim 1, wherein the actual battery characteristic profile is a battery characteristic curve.

5. The method of claim 1, wherein operations of the method are performed upon powering up of the electronic device, and wherein taking the responsive action comprises transmitting a message to a user interface of the electronic device.

6. The method of claim 1, wherein the electronic device is a mobile device.

7. The method of claim 1, wherein recording performance of the battery comprises recording an output voltage of the battery.

8. The method of claim 7, wherein applying the electrical load comprises applying high-load pulses to the battery during an initial period when an AC portion of the Equivalent Series Resistance (ESR) is pronounced, and where the actual battery characteristic profile is generated by recording the output voltage of the battery.

9. The method of claim 7, wherein the actual battery characteristic profile represents said output voltage of the battery versus capacity when discharging the battery under a constant load.

10. The method of claim 1, wherein recording the performance of the battery comprises determining capacity versus cycle count of the battery for at least one depth of discharge.

11. The method of claim 1, wherein recording the performance of the battery comprises determining capacity versus temperature of the battery.

12. An electronic device comprising a counterfeit/defective battery detector for detecting whether a battery in the electronic device is counterfeit or defective, the counterfeit/defective battery detector configured for:
determining one or more specified conditions for operating the battery on the electronic device;
generating, by the electronic device and based on the one or more specified conditions, at least an electrical load;
applying, by the electronic device, the electrical load to the battery, the electrical load changing one or more electrical characteristics of the battery;
generating, on the electronic device, an actual battery characteristic profile by recording performance of the battery during use of the battery while the electrical load being applied;
retrieving from a memory element, an expected battery characteristic profile defining parameters expected when a legitimate battery operates under specified conditions corresponding to the electrical load, the memory element storing a plurality of expected battery characteristic profiles each corresponding to different conditions;
comparing the expected battery characteristic profile with the actual battery characteristic profile to determine a value representing an error between said expected battery characteristic profile and the actual battery characteristic profile; and
in response to the value exceeding an error threshold, sending, by the electronic device, at least one notification to a user indicating the battery as at least one of counterfeit and defective.

13. The device of claim 12, wherein the electronic device further comprises a database, and wherein the retrieving an expected battery characteristic profile corresponding to the actual battery characteristic profile comprises:
checking if the expected battery characteristic profile is stored on a database on the electronic device; and if not then
requesting from a remote server the expected battery characteristic profile.

14. The device of claim 12, wherein the counterfeit/defective battery detector is configured for the electrical load by applying high-load pulses to the battery during an initial period when an AC portion of the Equivalent Series Resistance (ESR) is pronounced, and where the actual battery characteristic profile is generated by recording an output voltage of the battery.

15. The device of claim 12, wherein the actual battery characteristic profile is a battery characteristic curve.

16. The device of claim 12 wherein the counterfeit/defective battery detector is configured to operate upon powering up of the device.

17. The device of claim 12, wherein said device is a mobile device.

18. A non-transitory computer-readable medium having stored thereon computer-readable instructions for detecting whether a battery in an electronic device is counterfeit or defective, the computer readable instructions comprising instructions for:
determining one or more specified conditions for operating the battery on the electronic device;
generating, by the electronic device and based on the one or more specified conditions, at least an electrical load;
applying, by the electronic device, the electrical load to the battery, the electrical load changing one or more electrical characteristics of the battery;
generating, on the electronic device, an actual battery characteristic profile by recording performance of the battery during use of the battery while the electrical load being applied;
retrieving from a memory element, an expected battery characteristic profile defining parameters expected when a legitimate battery operates under specified conditions corresponding to the electrical load, the memory element storing a plurality of expected battery characteristic profiles each corresponding to different conditions;
comparing the expected battery characteristic profile with the actual battery characteristic profile to determine a value representing an error between the expected battery characteristic profile and the actual battery characteristic profile; and
taking a responsive action on the electronic device when the value exceeds an error threshold.

19. The computer-readable medium of claim 18, wherein the retrieving an expected battery characteristic profile corresponding to the actual battery characteristic profile comprises instructions for:
checking if the expected battery characteristic profile is stored on a database on the electronic device; and if not then requesting from a remote server the expected battery characteristic profile.

20. The computer-readable medium of claim 18, wherein at least the retrieving and comparing instructions are performed on a remote server, and the remote server communicates with the electronic device over a wireless link.

21. The computer-readable medium of claim 18, wherein the battery characteristic profile is a battery characteristic curve.

22. The computer-readable medium of claim 18, wherein the instructions are performed upon powering up of the electronic device, and wherein taking the responsive action comprises transmitting a message to a user interface of the electronic device.

23. The computer-readable medium of claim 18, wherein the electronic device is a mobile device.

24. The computer readable medium of claim 18, wherein recording performance of the battery comprises recording an output voltage of the battery.

25. The computer-readable medium of claim 24, wherein the instructions comprise instructions for generating the actual battery characteristic profile by applying high-load pulses to the battery during an initial period when an AC portion of the Equivalent Series Resistance (ESR) is pronounced, and recording the output voltage of the battery.

26. The computer readable medium of claim 24, wherein the actual battery characteristic profile represents the output voltage of the battery versus capacity when discharging the battery under a constant load.

27. The computer readable medium of claim 18, wherein recording the performance of the battery comprises determining capacity versus cycle count of the battery for at least one depth of discharge.

28. The computer readable medium of claim 18, wherein recording the performance of the battery comprises determining capacity versus temperature of the battery.

* * * * *